(12) United States Patent
Kelly et al.

(10) Patent No.: US 10,672,740 B2
(45) Date of Patent: *Jun. 2, 2020

(54) SEMICONDUCTOR PACKAGE WITH HIGH ROUTING DENSITY PATCH

(71) Applicant: Amkor Technology, Inc., Tempe, AZ (US)

(72) Inventors: Michael Kelly, Queen Creek, AZ (US); Ronald Patrick Huemoeller, Gilbert, AZ (US); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/127,575

(22) Filed: Sep. 11, 2018

(65) Prior Publication Data
US 2019/0043829 A1 Feb. 7, 2019

Related U.S. Application Data

(63) Continuation of application No. 14/686,725, filed on Apr. 14, 2015, now Pat. No. 10,074,630.

(51) Int. Cl.
*H01L 25/065* (2006.01)
*H01L 25/00* (2006.01)
(Continued)

(52) U.S. Cl.
CPC ........ *H01L 25/0655* (2013.01); *H01L 21/563* (2013.01); *H01L 21/6835* (2013.01);
(Continued)

(58) Field of Classification Search
CPC ....... H01L 2224/32225; H01L 2224/97; H01L 2224/4824; H01L 2224/32145;
(Continued)

(56) References Cited

U.S. PATENT DOCUMENTS 7,402,901 B2 * 7/2008 Hatano ............... H01L 23/5389
257/684
8,531,032 B2 * 9/2013 Yu ....................... H01L 23/3114
257/738

(Continued)

*Primary Examiner* — Khiem D Nguyen
(74) *Attorney, Agent, or Firm* — McAndrews, Held & Malloy, Ltd.

(57) ABSTRACT

Methods and systems for a semiconductor package with high routing density routing patch are disclosed and may include a semiconductor die bonded to a substrate and a high routing density patch bonded to the substrate and to the semiconductor die, wherein the high routing density patch comprises a denser trace line density than the substrate. The high routing density patch can be a silicon-less-integrated module (SLIM) patch, comprising a BEOL portion, and can be TSV-less. Metal contacts may be formed on a second surface of the substrate. A second semiconductor die may be bonded to the substrate and to the high routing density patch. The high routing density patch may provide electrical interconnection between the semiconductor die. The substrate may be bonded to a silicon interposer. The high routing density patch may have a thickness of 10 microns or less. The substrate may have a thickness of 10 microns or less.

13 Claims, 9 Drawing Sheets

(51) Int. Cl.
    *H01L 23/31*     (2006.01)
    *H01L 21/56*     (2006.01)
    *H01L 23/538*     (2006.01)
    *H01L 23/00*     (2006.01)
    *H01L 21/683*     (2006.01)
    *H01L 23/498*     (2006.01)

(52) U.S. Cl.
CPC ...... H01L 23/3128 (2013.01); H01L 23/5383 (2013.01); H01L 23/5385 (2013.01); H01L 24/14 (2013.01); H01L 25/50 (2013.01); *H01L 23/49816* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 24/92* (2013.01); *H01L 2221/68359* (2013.01); *H01L 2221/68363* (2013.01); *H01L 2224/131* (2013.01); *H01L 2224/13023* (2013.01); *H01L 2224/13147* (2013.01); *H01L 2224/1403* (2013.01); *H01L 2224/16227* (2013.01); *H01L 2224/16235* (2013.01); *H01L 2224/2939* (2013.01); *H01L 2224/29294* (2013.01); *H01L 2224/32225* (2013.01); *H01L 2224/73204* (2013.01); *H01L 2224/81191* (2013.01); *H01L 2224/81815* (2013.01); *H01L 2224/83102* (2013.01); *H01L 2224/83192* (2013.01); *H01L 2224/83385* (2013.01); *H01L 2224/92125* (2013.01); *H01L 2924/014* (2013.01); *H01L 2924/01014* (2013.01); *H01L 2924/15192* (2013.01); *H01L 2924/15311* (2013.01); *H01L 2924/15313* (2013.01); *H01L 2924/15738* (2013.01); *H01L 2924/18161* (2013.01)

(58) Field of Classification Search
CPC ......... H01L 23/49827; H01L 23/49816; H01L 23/5384; H01L 25/0655; H01L 24/14; H01L 24/19; H01L 24/24; H01L 2224/1403

See application file for complete search history.

(56) References Cited

U.S. PATENT DOCUMENTS

| | | | | |
|---|---|---|---|---|
| 8,916,981 | B2 * | 12/2014 | Xiu | H01L 23/5385 257/788 |
| 10,074,630 | B2 * | 9/2018 | Kelly | H01L 21/6835 |
| 2009/0244874 | A1 * | 10/2009 | Mahajan | H01L 24/16 361/809 |
| 2010/0327424 | A1 * | 12/2010 | Braunisch | H01L 23/13 257/692 |
| 2013/0168854 | A1 * | 7/2013 | Karikalan | H01L 24/17 257/738 |
| 2013/0217188 | A1 * | 8/2013 | Wang | H01L 21/563 438/118 |
| 2015/0116965 | A1 * | 4/2015 | Kim | H05K 1/11 361/767 |
| 2016/0056125 | A1 * | 2/2016 | Pan | H01L 25/0655 257/676 |

* cited by examiner

SEMICONDUCTOR PACKAGE WITH HIGH ROUTING DENSITY PATCH

CROSS-REFERENCE TO RELATED APPLICATIONS/INCORPORATION BY REFERENCE

This application is a continuation of U.S. patent application Ser. No. 14/686,725, filed Nov. 14, 2016, and titled "SEMICONDUCTOR PACKAGE WITH HIGH ROUTING DENSITY PATCH, issued as U.S. Pat. No. 10,074,630, the entire contents of which are hereby incorporated herein by reference, in their entirety.

FIELD

Certain embodiments of the disclosure relate to semiconductor chip packaging. More specifically, certain embodiments of the disclosure relate to a method and system for a semiconductor package having a high routing density patch which can comprise a silicon-less integrated module (SLIM).

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in a semiconductor package with high routing density patch, which can comprise a silicon-less integrated module (SLIM) to increase routing density. Example aspects of the disclosure include an electronic device comprising a semiconductor die bonded to a first surface of a substrate and a high routing density patch bonded to the substrate, wherein the high routing density patch comprises a denser trace line density than the first substrate. In some examples, the routing density of the high routing density patch can be in the submicron range. The electronic devise may also comprise an encapsulant encapsulating at least a portion of the semiconductor die, the high routing density patch, and the first surface of the substrate encapsulated utilizing an encapsulant, as well as metal contacts on a second surface of the substrate. A second semiconductor die may be bonded to the first surface of the substrate and the high routing density patch. The high routing density patch may provide electrical interconnection between the semiconductor die and the second semiconductor die. The substrate may be on an interposer, which may comprise silicon. The high routing density patch may have a thickness of 10 microns or less. The metal contacts may comprise solder balls. The substrate may have a thickness of 10 microns or less.

Figure 1:
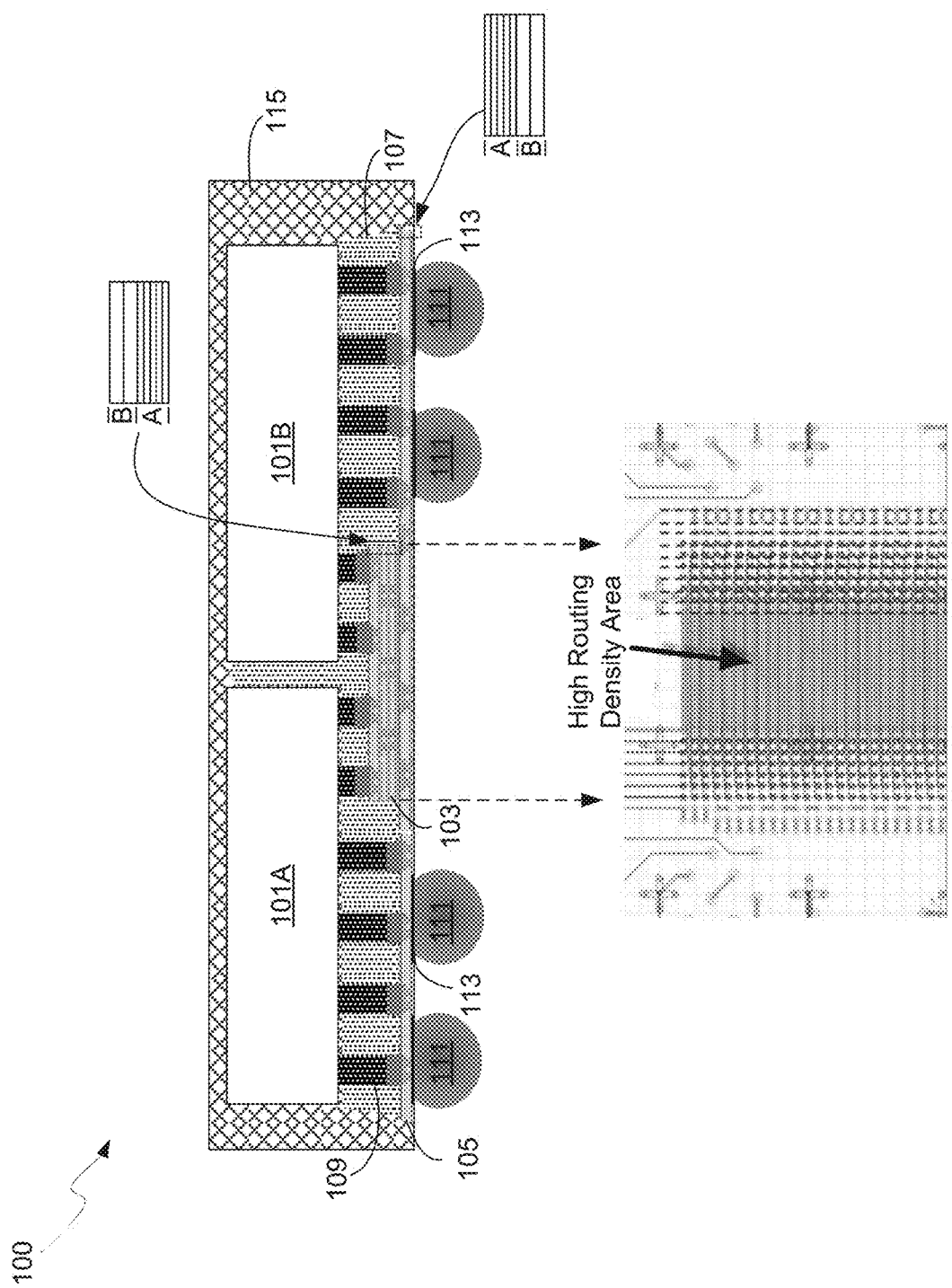
FIG. 1 illustrates a semiconductor package with top die bonded to a high routing density patch, in accordance with an example embodiment of the disclosure.

FIG. 1 illustrates a semiconductor package with top die bonded to a high routing density patch, in accordance with an example embodiment of the disclosure. Referring to FIG. 1, there is shown a package 100 comprising semiconductor die 101A and 101B, high routing density patch 103, substrate 105, underfill material 107, metal contacts 109, contact structures 111, under bump metal (UBM) 113, and encapsulant 115. As can be seen in FIG. 1, patch 103 can be located between a surface of semiconductor die 101A/B and a surface of substrate 105, but patch 103 need not cover all of the such surface of semiconductor die 101A/B, and may extend past a perimeter of such surface of semiconductor die 101A/B.

The die 101A and 101B may each comprise an integrated circuit die separated from a semiconductor wafer, and may comprise electrical circuitry such as digital signal processors (DSPs), network processors, power management units, audio processors, RF circuitry, wireless baseband system-on-chip (SoC) processors, sensors, and application specific integrated circuits, for example.

The patch 103 may, for example, comprise a thin high routing density patch that can provide high density interconnects between the semiconductor die 101A/101B, and/or between the die 101A/101B and the substrate 105. In the present example, patch 103 may comprise a silicon-less integrated module (SLIM) patch, such that there is substantially no silicon or other semiconductor in its layered structure, and/or no through-semiconductor via (TSV) therethrough. Patch 103 may be produced with two portions in some SLIM embodiments. A Back-End-Of-the-Line (BEOL) portion (see e.g, portion "a" of inset in FIG. 1) of the SLIM patch can be fabricated to comprise semiconductor-fab-style BEOL interconnection layers, which can comprise inorganic dielectric materials, such as SiN, $SiO_2$, or oxy-nitride, and/or which can be devoid of organic dielectric materials. An RDL portion (see e.g. portion "b" of inset in FIG. 1) of the SLIM patch can be formed to comprise a post-fab redistribution layer (RDL) formed on the BEOL portion, and can have organic dielectric materials such as polyimide, and/or PBO. In some examples, the thickness of the BEOL portion can be greater than the thickness of the RDL portion of the SLIM patch. In the same or other examples, the BEOL portion of the SLIM patch can comprise a greater number of conductive layers than the RDL portion of the SLIM patch. As a non-limiting example, in some implementations inorganic BEOL can produce more planar layers than those produced via RDL with organic dielectrics, such that the BEOL portion of the patch can have 3 or more conductive layers, while the RDL portion may need to be limited to 3 or less conductive layers due to planarity concerns. Notwithstanding the above, there can be examples where the BEOL portion can comprise less than 3 conductive layers. In the same or other examples, the separation and/or the dielectric between conductive layers in the BEOL portion of the SLIM patch can be thinner than in the RDL portion of the SLIM patch. There can be examples, however, where the SLIM patch can comprise the BEOL portion without the RDL portion. There can also be examples where patch 103 need not be a SLIM patch but still comprises higher routing density than substrate 105.

The conductive layer(s) in the patch 103 may comprise copper, nickel, and/or gold, for example. The SLIM structure can be substantially devoid of semiconductor material, such as in a silicon or glass interposer, because silicon and glass are more lossy compared to the dielectric/metal structure of the SLIM structure. Furthermore, SLIM structures can be thinner than silicon or glass interposers, and/or can provide finer pitch for conductive traces thereat.

The patch 103 may be 5-10 μm thick (or, for example, <5 μm thick), and may comprise rows and/or columns of interconnections with high routing density, such as 0.5-1.0 μm line and/or line spacing between lines (or, for example, <0.5 μm lines or line spacing), and/or a 30 μm pitch for the columns (or, for example, <30 μm pitch), for example, but the disclosure is not so limited as larger or smaller trace line or line spacing size/pitch may be utilized depending on the desired interconnect density. The patch 103 may comprise one or more metal layers 106 and dielectric layers 108 (see, e.g., FIG. 2A) to provide isolated high density electrical interconnection for devices and structures coupled to the patch 103.

The substrate 105 may comprise a substrate with a dielectric/metal layered structure, but may have lower routing density, enabling a lower cost structure than the higher cost high routing density interconnects of patch 103, Substrate 105 may comprise one or more metal layers 116 and dielectric layers 118 (see, e.g., FIG. 2A) to provide isolated electrical interconnection for devices and structures coupled to the substrate. In some examples, substrate 105 may be a SLIM similar to the SLIM version of patch 103 as described above, but can comprise lower routing density than patch 103.

The underfill material 107 may be utilized to fill the space between the die 101A/101B, and/or between the die 101A/101B and the substrate 105, and/or between the die 101A/101B and the patch 103. Underfill material 107 may provide mechanical support for the bond between the die 101A/101B and the substrate 105, and between the die 101A/101B and the patch 103, as well as provide protection for the metal contacts 109. The height of the underfill material may be on the order of 10-25 μm, for example. The underfill material 107 may comprise a pre-applied underfill or a capillary underfill applied following the bonding of the die 101A/101B to the substrate 105. In an example scenario, the underfill material 107 may comprise a non-conductive paste.

The encapsulant 115 may comprise an epoxy material or mold compound, for example, that may protect the die, patch 103, and substrate 103 from the external environment and provide physical strength for the package 100. It should be noted that the encapsulant is an optional structure, and may be excluded when the substrate 105 provides enough physical strength for the package 100, for example.

The metal contacts 109 may comprise various types of metal (or conductive) interconnects for bonding a die to a substrate, such as micro-bumps, metal pillars, solder bumps, solder balls, for example. In an example scenario, the metal contacts 109 comprise copper pillars with a solder bump (or cap) for reflowing and bonding to contact pads on the substrate 105. In the same or other examples, metal contacts 109 may comprise a fine pitch of approximately 20-50 μm, and/or a coarse pitch of approximately 90-100 μm.

The contact structures 111 may comprise metal pillars, solder bumps, solder balls, microbumps, or lands, for example. The contact structures may have different size ranges, such as bumps of 100-200 μm, or micro bumps/pillars of 20-100 μm. In instances where solder bumps are used, the contact structures may comprise one or more solder metals that melt at a lower temperature than the other metals, such that upon melting and subsequent cooling, the contact structures 111 provide mechanical and electrical bonding between the semiconductor package 100 and an external circuit board or other package. The contact structures 111 may comprise a ball grid array (BGA) or land grid array (LGA), for example. Though solder balls are illustrated, the contacts 111 may comprise any of a variety of types of contacts.

The UBM 113 may comprise thin metal layer(s) formed on the substrate 105 for receiving the contact structures 111. The UBM 113 may comprise a single or multiple layers comprising materials such as copper, chrome/chrome-copper alloy/copper (Cr/Cr—Cu/Cu), titanium-tungsten alloy/copper (Ti—W/Cu), aluminum/nickel/copper (Al/Ni/Cu), or other suitable metal for making contact with the substrate 105 and the contact structures 111.

The cost to design an entire system-on-chip (SOC) into finer CMOS technology nodes, such as 10 nm CMOS (i.e., 10 nm gate length CMOS process) can be prohibitive. Die sizes are not shrinking fast, due to some components in the die that do not scale down in x-y size at the next technology node. SRAM used for L0 or L1 cache is an example of die size not scaling down with gate size. The net outcome is that 10 nm defect density of the 10 nm node may be much higher due to manufacturing complexity, and may double the cost of 14/15 nm CMOS per wafer, while the resulting die size is not reduced much, if at all.

For these reasons, the 10 nm silicon CMOS node may advantageously be utilized for those items where the payback in performance (from the faster transistors) is needed (e.g. CPU cores, GPU cores, etc.), and the other functions of the die may be adequately fabricated in an older node, for example 28 nm or 14 nm. This means breaking what has historically been a single die SOC into a multi-die solution, where the functionality of the separate die is re-integrated at the IC package level. This is called "die split" or "die deconstruction", Various platforms for such a design may utilize a through-semiconductor via (TSV) or through-glass via (TGV) interposer approach. However, such an interposer may be relatively costly and thick (50-200 μm, at least), so to permit a lower cost and smaller device, especially for smaller packages such as those in the mobile market, the high routing density patch and/or substrate of the present disclosure may be utilized.

It should be noted that the SLIM patch/substrate is not only applicable to technology nodes at or lower than 10 nm. Accordingly, the SLIM patch/substrate may be used in any application where high density interconnects are desired, particularly in a small area where a patch may be most space and cost effective. For example, SLIM patch/substrates may be used with 14 nm technology.

Figures 2A, 2B:
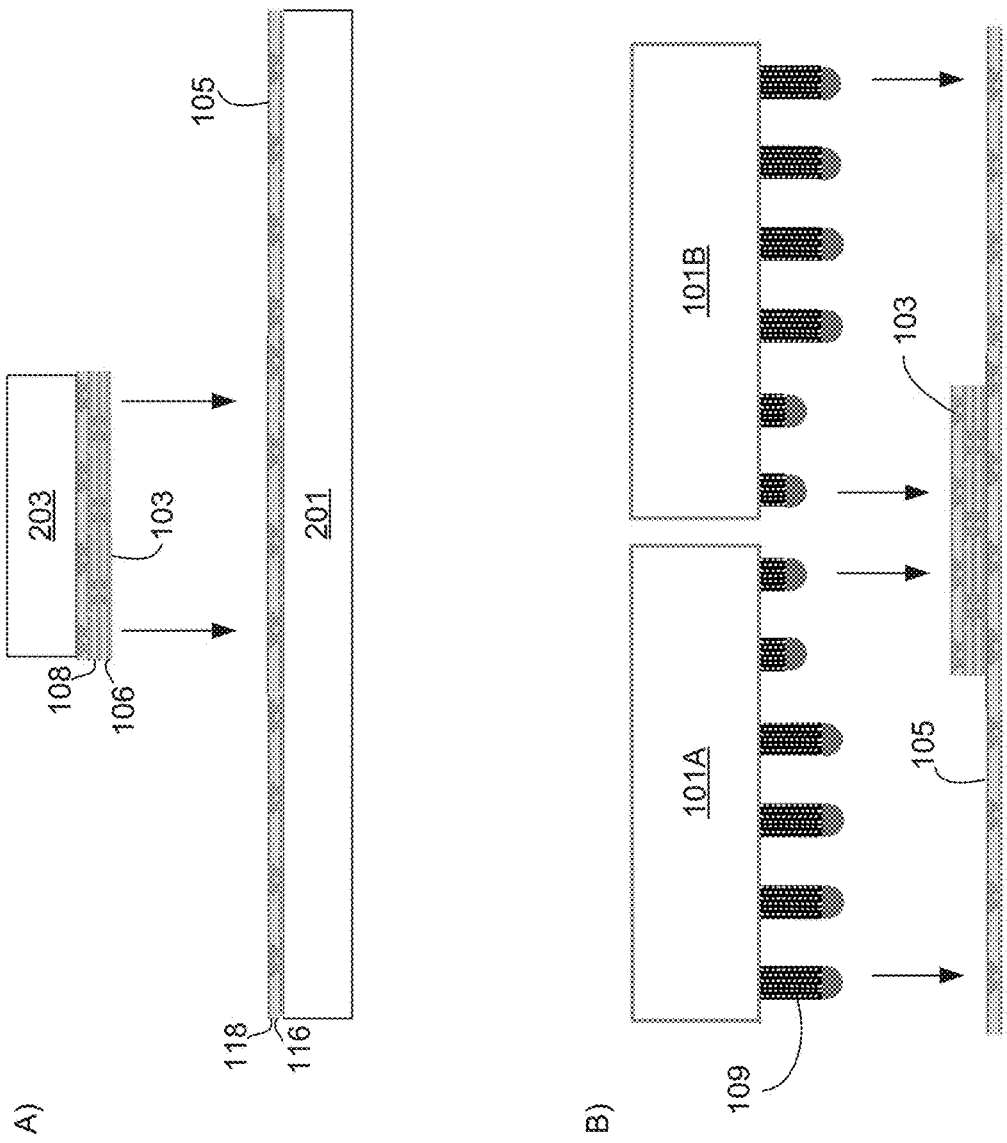
FIGS. 2A-2D illustrate example steps in forming the semiconductor package with top die bonded to a high routing density patch, in accordance with an example embodiment of the disclosure.

In a die split, the required signal routing density may be very demanding for the areas of the two die immediately adjacent to one another, as illustrated in the inset of FIG. 1. Although there may be a larger die quantity, two die are shown simply for illustrative purposes here. The cost of SLIM may, for example, be driven by 1) the layer count, and 2) the line thickness and spacing required. For example, if the entire SLIM structure could be routed with 1 layer of 2 µm line and 2 µm spaces, this would be quite economical. However, as seen in the inset of FIG. 1, routing requirements between the die or in other areas may be more demanding, requiring more layers, and/or higher column, line, or line-spacing density, which increases costs significantly. If there is even one small location on the SLIM substrate with 0.5/0.5 µm line and/or line spacing (for example), the cost of the entire substrate will be at that routing premium. As shown in FIG. 2A, the substrate 105 may be SLIM formed on wafer 201, which may comprise silicon, for example, during BEOL processing, and then removed for the finished package 100. In another example scenario, a thin layer of the silicon of wafer 201 may be left on substrate 105.

In an example scenario, if an area needing higher routing density, i.e., the area shown in the inset of FIG. 1, could be interconneced using a high routing density patch, such as the patch 103, then the overall package cost could be lower because the remainder of the area not needing such high routing density can be properly serviced with lower cost lower density routing, such as that provided by substrate 105. A wafer comprised of these smaller high routing density patches would produce a large number of units and thus the price per high routing density patch would be smaller. The non-high routing density substrate (e.g., substrate 105) spanning the x-y dimensions of both die could have coarser line and/or line spacing density (e.g. 2 µm/2 µm, line and line spacing, or greater) than those of the high routing density patch.

FIGS. 2A-2D illustrate example steps in forming the semiconductor package with top die bonded to a high routing density patch, in accordance with an example embodiment of the disclosure. FIGS. 2A-2D may share any and all features of FIG. 1. Referring to FIG. 2A, there is shown the patch 103 and the substrate 105. The patch 103 may be bonded to the substrate 105 utilizing corresponding metal contacts on the patch 103 and substrate 105. In some examples, however, patch 103 may be bonded to substrate 105 via an adhesive, and/or need not be electrically coupled directly to substrate 105, being intended in such cases to provide interconnection only between semiconductor die 101A and 101B.

In an example scenario, the substrate 105 and the patch 103 and may be formed on or supported by thicker support structures, like substrates 201 and 203 respectively, that may be in wafer or die form, for example. In an example scenario, the substrate 201 may comprise a silicon or glass wafer, and the substrate 203 may comprise a silicon or glass die that was diced wafer. Alternatively, the substrates 201 and 203 may both be in wafer form.

The patch 103 may be bonded to the substrate 105 utilizing various bonding technologies (e.g., adhesive, thermoconductive bonding, relatively high-temperature reflow, etc.). In instances where the patch 103 includes the substrate 203 for physical support when handling and bonding to the substrate 105, the substrate 203 may be substantially or fully removed before or after bonding.

Referring to FIG. 2B, the die 101A/101B may be bonded to both the patch 103 and the substrate 105. In an example scenario, a reflow process may be utilized to bond the metal contacts 109 to the patch 103 and substrate 105. The metal contacts 109 may comprise metal pillars with solder bumps, for example, where the pillars can have different height depending on whether they are bonded to the patch 103 or the substrate 105. In an example scenario, the pillars may comprise different cross-sectional shapes, widths, and/or pitch, for example.

Figures 2C, 2D:
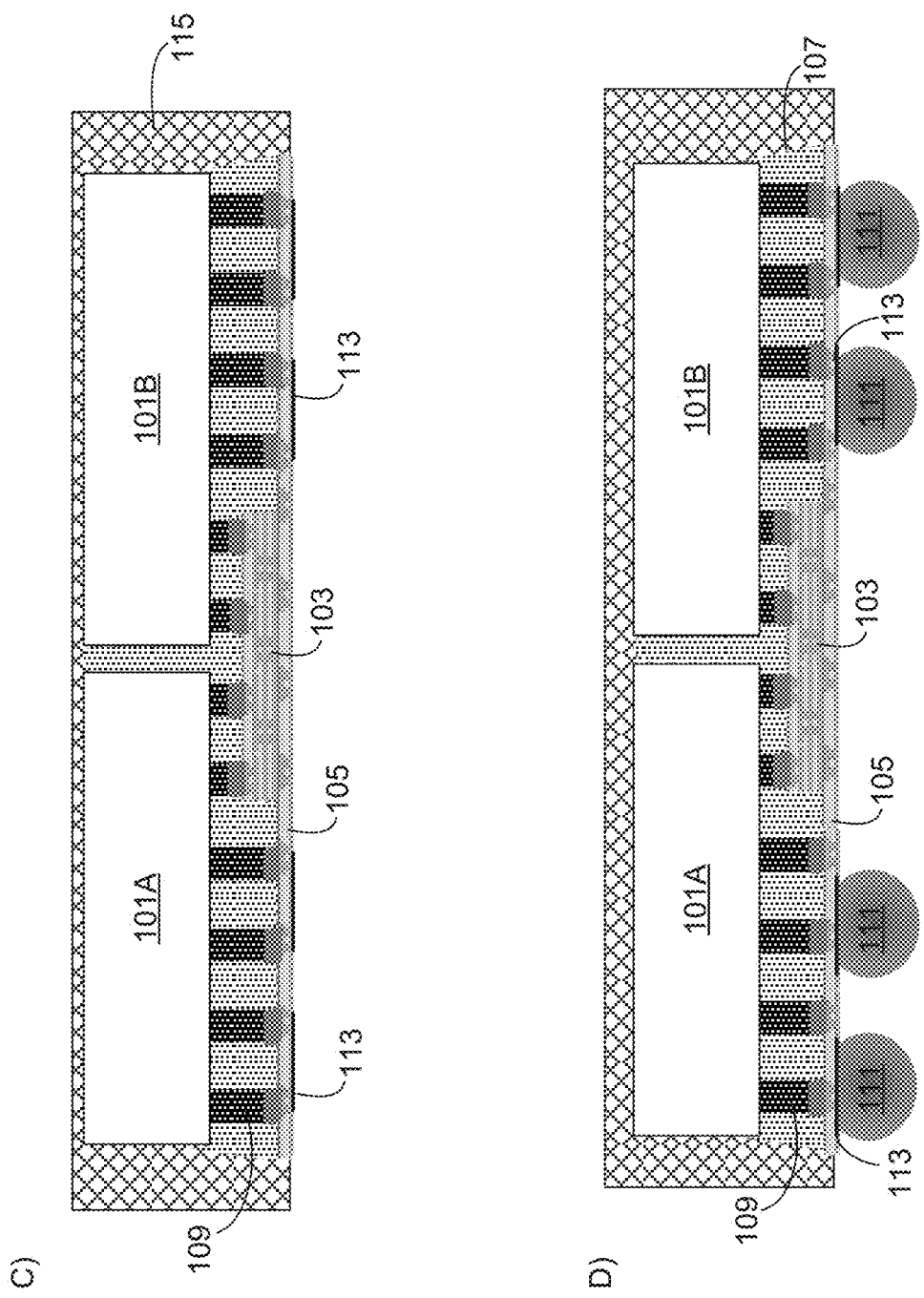

FIG. 2C illustrates the application of underfill material 107 to the structure of FIG. 2B, which may be applied in a capillary underfill process, for example, although the underfill material 107 may instead be pre-applied prior to bonding the die 101A/101B. In addition, FIG. 2C illustrates the UBM 113 applied to the bottom surface of the substrate 105. A passivation layer may be applied to the backside of the substrate 105 with openings for the subsequent formation of the UBM 113. Accordingly, the substrate 105 may comprise metal contacts and passivation layers on top and bottom surfaces for isolation and protection from environmental contaminants.

The semiconductor die 101A and 101B and the underfill 107 may be encapsulated by the encapsulant 115 for environmental protection and/or physical strength of the package. The encapsulant 115 is an optional structure, and may be excluded when the substrate 105 provides enough physical strength for the package 100, for example. In instances when the encapsulant 115 is utilized, the substrate 201 may be removed by etching or chemical-mechanical polishing, for example.

Finally, in FIG. 2D, the contact structures 111 may be placed on the UBM 113, resulting in the final structure, the semiconductor package 100. The contact structures 111 may comprise solder balls, for example, for bonding to an external printed circuit board or other device. Note, however, that any of a variety of contacts structures may be utilized.

Figure 3:
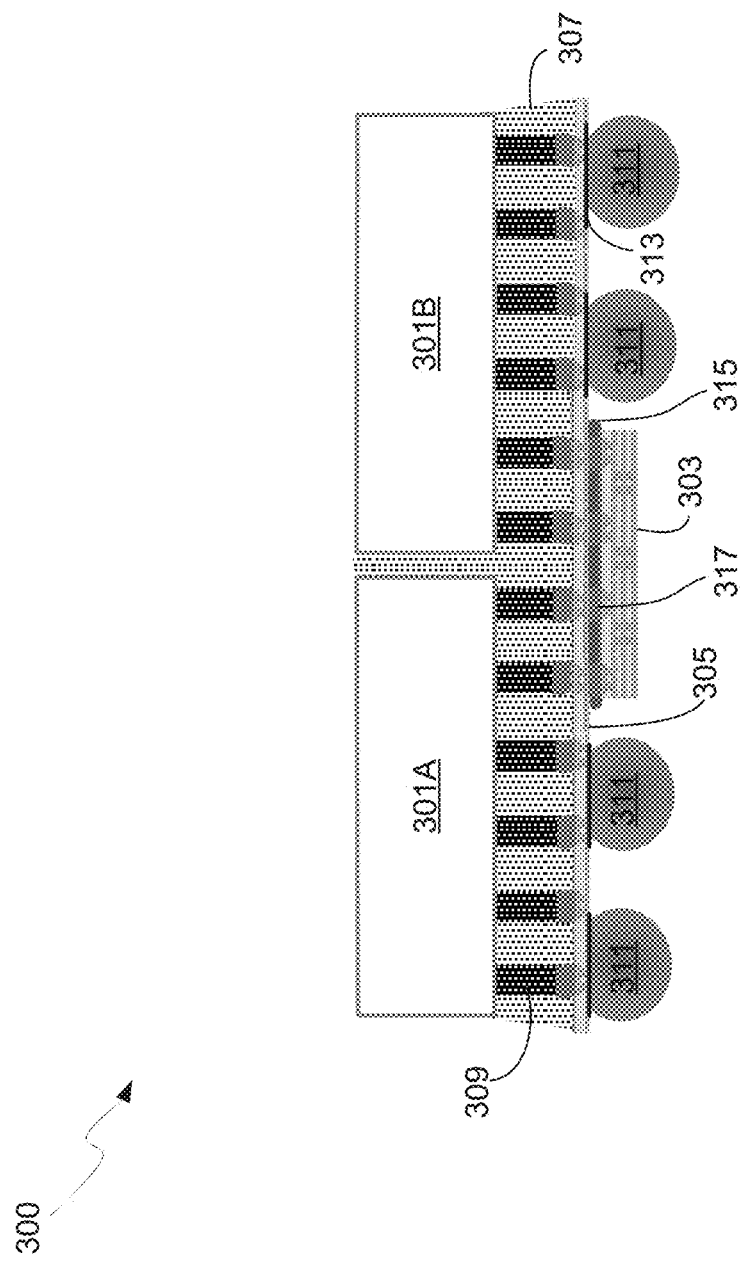
FIG. 3 illustrates a semiconductor package with backside mounted high routing density patch, in accordance with an example embodiment of the disclosure.

FIG. 3 illustrates a semiconductor package with backside mounted high routing density patch, in accordance with an example embodiment of the disclosure. FIG. 3 may share any and all of the corresponding features of FIGS. 1-2. Referring to FIG. 3, there is shown semiconductor package 300 comprising semiconductor die 301A and 301B, patch 303, substrate 305, underfill material 307, metal contacts 309, contact structures 311, UBM 313, underfill material 315, and patch contacts 317.

In this example, the patch 303, which can comprise a high routing density patch similar to patch 103, may be bonded to the bottom surface of the substrate 305, which can be similar to substrate 105. As the thickness of the patch 303 may be on the order of 5 µm thick or even less, and a few millimeters per side in area, it does not preclude the use of BGA bonding of the semiconductor package 300 or the utilization of any of a variety of different contact structures having a standoff greater than 5 µm. Similarly, the substrate 305 can comprise a SLIM substrate, but with lower routing density compared to the patch 303.

The underfill material 315 may be utilized to fill the space between the patch 303 and the substrate 305, and may provide mechanical support for the bond between the structures as well as provide protection for the patch contacts 317. The underfill material 315 may, for example, comprise a pre-applied underfill or a capillary underfill applied following the bonding of the patch 303 to the substrate 305. In an example scenario, the underfill material 313 may comprise a non-conductive paste.

The patch contacts 317 may comprise various types of metal interconnects for bonding the patch 303 to the substrate 305, such as micro-bumps, metal pillars, solder bumps, solder balls, etc.

Figures 4A, 4B:
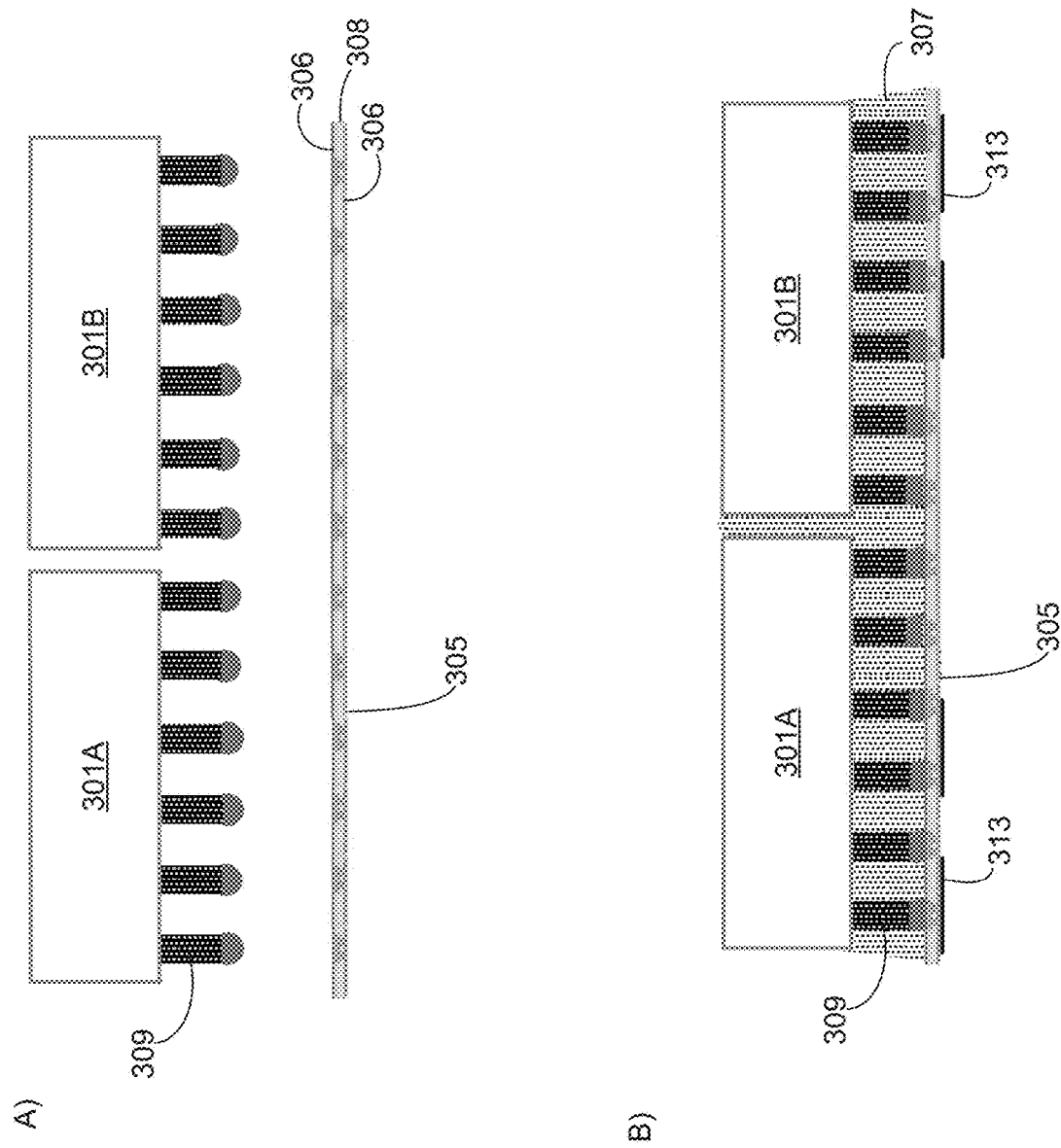
FIGS. 4A-4D illustrate example steps for forming a semiconductor package with backside mounted high routing density patch, in accordance with an example embodiment of the disclosure.

FIGS. 4A-4D illustrate example steps for fabricating a semiconductor package with backside mounted high density patch, in accordance with an example embodiment of the disclosure, FIGS. 4A-4D may share any and all of the corresponding features of FIGS. 1-3. Referring to FIG. 4A, the die 301A/301B may be bonded to the substrate 305 utilizing the metal contacts 309. The substrate 305 may comprise a SLIM substrate with a dielectric/metal layered structure on the order of 5-10 μm thick, and may comprise contact pads in the metal layer 306 for receiving the metal contacts 309, and dielectric layers 308 for isolating metal interconnections in the substrate 305.

The metal contacts 309 may comprise various types of metal interconnects for bonding a die to a substrate, such as metal pillars, solder balls, micro-bumps, etc. In an example scenario, the metal contacts 309 comprise copper pillars with a solder bump (or cap) for a reflow process to bond the metal contacts 309 to the contact pads in the metal layer 306 on the substrate 305.

In FIG. 4B, underfill material 307 may be applied in a capillary underfill process, for example. In another example scenario, the underfill material 307 may be a pre-applied underfill material that assists in bonding the metal contacts 309 to the substrate 305.

FIG. 4B also shows the forming of the UBM 313 on the bottom surface of the substrate 305 for receiving contact structures 311. Accordingly, the substrate 305 may comprise contact pads in the metal layers 308 for receiving the UBM 313 and passivation layers on top and bottom surfaces for electrical isolation and protection from environmental contaminants.

Figures 4C, 4D:
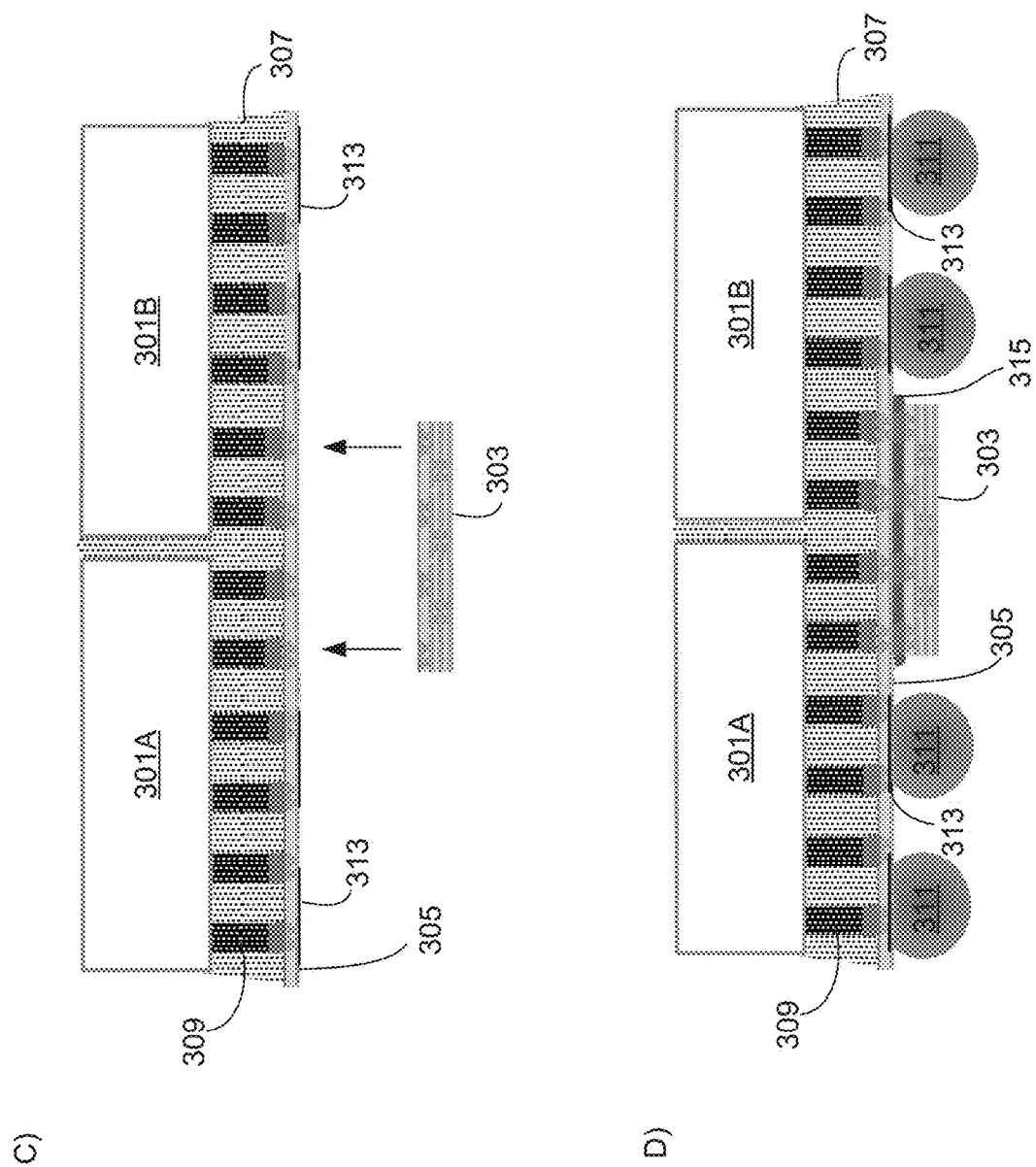

In FIG. 4C, the patch 303 may be bonded to the bottom surface of the substrate 305 utilizing metal contacts (not shown) in the metal layers 306 on the substrate 305 and like layers on the patch 303. An underfill material 315 may be pre-applied on the substrate 305 or may applied between the substrate 305 and the patch 303 after bonding in a capillary underfill process. The underfill material 315 may assist in the bonding process of the patch 303 to the substrate 305.

Finally, the contact structures 311 may be formed on the UBM 313, resulting in the final structure, the semiconductor package 300. A reflow process may be utilized to adhere the contact structures 311, which may comprise solder balls, for example, to the UBM 313. As explained herein, the method and structure shown and discussed with regard to FIG. 4 may share any or all characteristics with other methods and structures discussed herein. For example, in an example implementation patches may be coupled to both sides of the substrate. In addition, die may also be bonded to both sides of the substrate.

Figure 5:
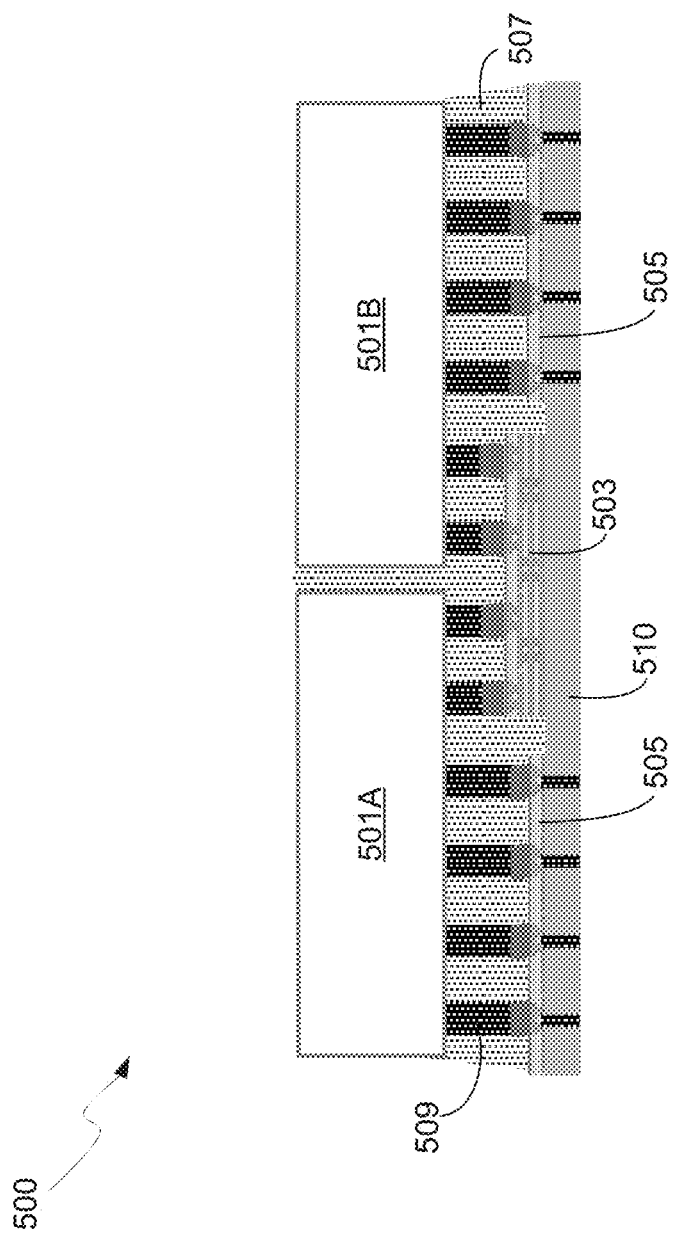
FIG. 5 illustrates a semiconductor package with a high routing density patch on an interposer, in accordance with an example embodiment of the disclosure.

FIG. 5 illustrates a semiconductor package with a high density patch on an interposer, in accordance with an example embodiment of the disclosure. Referring to FIG. 5, there is shown semiconductor package 500 comprising semiconductor die 501A and 501B, patch 503, substrate 505, underfill material 507, metal contacts 509, and interposer 510. FIG. 5 may share any and all of the corresponding features of FIGS. 1-4. For example, patch 503 can be similar to patch 103, and/or substrate 505 can be similar to substrate 105.

In this example, the patch 503, which can comprise a high routing density patch, may be bonded to the top surface of interposer 510. The thickness of the structures in FIG. 5 are not to scale. For example, interposers in general are much thicker than the SLIM structures, the patch 503 and substrate 505, on the order of 50-200 μm, for example. In addition, by incorporating high routing density interconnects in the patch with a standard interposer structure, costs may be greatly reduced, since by incorporating the patch 503, the layer count of the thin film routing in the interposer 510 may be reduced.

Figures 6A, 6B:
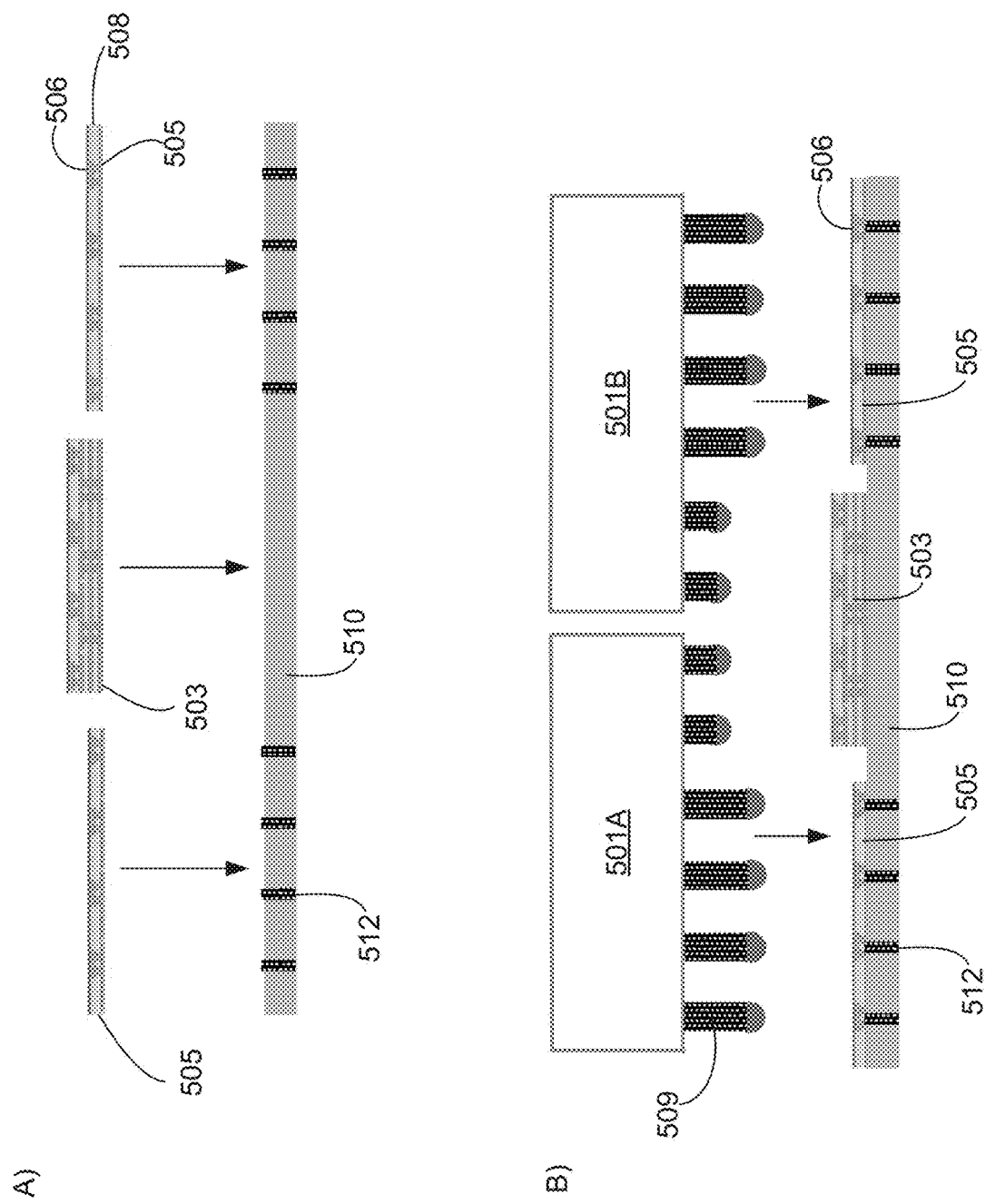
FIGS. 6A-6C illustrate example steps in forming a semiconductor package with a high routing density patch on an interposer, in accordance with an example embodiment of the disclosure.
Figure 6C:
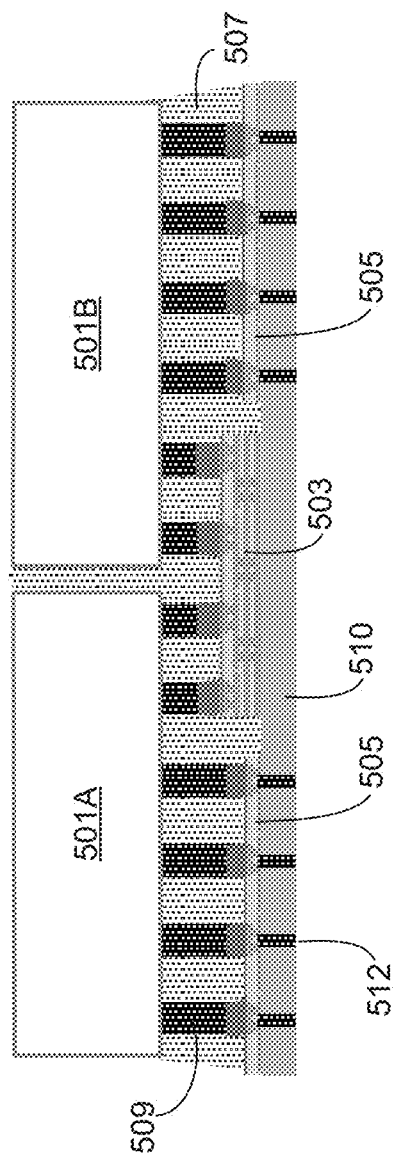

FIGS. 6A-6C illustrate example steps in fabricating a semiconductor package with a high routing density patch on an interposer, in accordance with an example embodiment of the disclosure. FIGS. 6A-6C may share any and all of the features of FIGS. 1-5. Referring to FIG. 6A, there is shown interposer 510, patch 503, and substrate 505. The patch 503 and/or the substrate 505 may comprise SLIM structures comprising metal and dielectric layers as described above with respect to patch 103 and substrate 105 respectively.

The substrate 505 is shown in cross-section in FIG. 6A and may comprise a SLIM substrate with an opening in the center where the patch 503, which can comprise a SLIM high density patch, may be bonded to the interposer 510. The substrate 505 may comprise one or more metal layers 506 and dielectric layers 508, and may comprise substantially no silicon in its layered structure, which may be more lossy for electrical signals.

The interposer 510 (and any interposer discussed herein) may comprise, for example, a silicon or glass interposer with TSVs, or a laminate interposer, with insulating and conductive materials for providing electrical contact between the die 501A/501B and a structure to which the interposer 510 is bonded, either via the patch 503 or the substrate 505. Metal contacts in or on the metal layers 506 in the substrate 505 may be electrically coupled to vias 512 in the interposer 510, as shown in FIG. 6A with the resulting structure shown in FIG. 6B.

FIG. 6B shows the die 501A/501B being bonded to the patch 503 and the substrate 505 utilizing the metal contacts 509. The metal contacts 509 may comprise various types of metal interconnects for bonding a die to a substrate, such as metal pillars, solder balls, micro-bumps, etc. In an example scenario, the metal contacts 509 comprise copper pillars with a solder bump (or cap) for a reflow process to bond the metal contacts 509 to contact pads in the metal layer 506 on the substrate 505.

The metal contacts 509 may be of different height based on whether they are bonded to the patch 503 or substrate 505, in instances where the thickness of these structures are different. The patch 503 may be thicker than the substrate 505 when the patch comprises multiple layers for a large number of high routing density interconnections between the die 501A and 501B and other structures coupled to the interposer 510. Alternatively, the patch 503 may be thinner than the substrate 505 (e.g., resulting in longer metal contacts 509 for connection to the patch 503 than for connection to the substrate 505) or the same thickness (e.g., resulting in a generally consistent contact length for both connection to the patch 503 and the substrate 505).

An underfill material 507 may be formed between the die 501A/501B and the substrate 505 and the patch 503 as well as between the die 501A/501B. In an example scenario, the underfill material 507 may be formed in a capillary underfill process. In an alternative scenario, the underfill material 507 may be pre-applied underfill and assist in bonding the metal contacts 509 to the substrate 510. The resulting structure is shown in FIG. 6C.

The interposer 510, for example, may comprise a silicon substrate with TSVs 512 for electrically coupling the die 501A and 501B to an external printed circuit board or other external devices via the metal contacts 509 and the patch/substrate 503/505. By incorporating a high routing density patch, the patch 503, with the interposer 510, costs may be greatly reduced, since the patch 503 includes the high density interconnects such that the layer count of the thin film routing in the interposer 510 may be reduced.

Other variations are envisioned. For example, substrate 105 (FIGS. 1-2) and/or substrate 305 (FIGS. 3-4) can be or can be referred to as an interposer, which may be similar to interposer 510 in some implementations. Also, as described with respect to FIGS. 1-4, it is possible to mount a SLIM patch to a substrate, and then bond the die to the overall combination of SLIM+substrate, with or without an interposer. In some cases, several SLIM patches may be bonded to a substrate to allow multiple die to connect in this manner. For example, substrate(s) 505 in FIGS. 5-6 can be in patch form similar to patch 503, whether in SLIM format and/or with lower routing density or not, and/or whether coupled to interposer 510 or to a non-SLIM substrate. As another example, FIGS. 1-4 can inherently comprise a combination of multiple patches 103 and/or 303 to permit further interconnectivity between multiple die.

In an embodiment of the disclosure, a method and system are disclosed for a semiconductor package having a high routing density patch which can comprise a silicon-less integrated module (SLIM). In this regard, aspects of the disclosure may comprise bonding a semiconductor die to a first surface of a substrate and a high routing density patch bonded to the substrate. The semiconductor die, the high routing density patch, and the substrate may be encapsulated utilizing an encapsulant.

Metal contacts may be formed on a second surface of the substrate. A second semiconductor die may be bonded to the first surface of the substrate and the high routing density patch. The high routing density patch may provide electrical interconnection between the semiconductor die. The substrate may be bonded to an interposer. The high routing density patch may have a thickness of 10 microns or less. The metal contacts may comprise solder balls. The substrate may have a thickness of 10 microns or less.

A portion of the thickness of the high routing density patch may comprise alternating layers of metal and inorganic dielectric layers (BEOL structure) and another portion of the thickness of the high routing density patch may comprise alternating layers of metal and organic dielectric layers.

In one embodiment of the disclosure, a semiconductor die may be bonded to a first surface of a substrate and a high routing density patch bonded to a second surface of the substrate opposite to the first surface, wherein the substrate and the high routing density patch comprise no semiconductor layers. At least a portion of the semiconductor die and the substrate may be encapsulated utilizing an encapsulant and metal contacts may be on the second surface of the substrate.

A second semiconductor die may be bonded to the first surface of the substrate. The high routing density patch may provide electrical interconnection between the semiconductor die and the second semiconductor die. The high routing density patch may have a thickness of 10 microns or less.

In some examples, there can be embodiments where substrate 105, 305, and/or 505 need not be a SLIM substrate, but can be, for example, a laminate interposer or a silicon/glass interposer with vias, such as described with respect to interposer 510.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. An electronic device comprising:
   a substrate comprising a first substrate side and a second substrate side opposite the first substrate side;
   a high routing density patch bonded to the first substrate side, wherein the high routing density patch comprises a dielectric layer that has a width less than a width of the first substrate side; and
   a semiconductor die coupled to the second substrate side, wherein:
      the high routing density patch comprises a denser trace line density than the substrate;
      the semiconductor die is electrically coupled to the substrate with a first conductive pillar having a first height and with a first solder distinct from and vertically shorter than the first conductive pillar; and
      the semiconductor die is electrically coupled to the substrate with a second conductive pillar having a second height substantially equal to the first height, wherein the semiconductor die is electrically coupled to the high routing density patch through the second conductive pillar and through the substrate.

2. The electronic device of claim 1, comprising conductive interconnection structures bonded to the second substrate side and directly laterally displaced from the high routing density patch.

3. The electronic device of claim 2, wherein the conductive interconnection structures vertically span the high routing density patch.

4. The electronic device of claim 2, wherein the conductive interconnection structures are solder balls.

5. The electronic device of claim 1, comprising a second semiconductor die bonded to the second substrate side, and wherein the high routing density patch provides at least a portion of an electrical path between the semiconductor die and the second semiconductor die.

6. The electronic device of claim 1, comprising:
   patch conductive interconnection structures that bond the high routing density patch to the first substrate side; and
   an underfill material directly between the high routing density patch and the substrate, and laterally surrounding the patch conductive interconnection structures.

7. The electronic device of claim 1, wherein the first conductive pillar is vertically between the first semiconductor die and the first solder, and the second conductive pillar is vertically between the first semiconductor die and the second solder.

8. An electronic device comprising:
   a signal redistribution structure (SRS) comprising a first SRS side and a second SRS side opposite the first SRS side, wherein the SRS comprises at least a first SRS conductive layer and a first SRS dielectric layer;
   a high routing density patch bonded to the first SRS side, wherein the high routing density patch comprises a dielectric layer that has a width less than a width of the first SRS side; and a semiconductor die coupled the second SRS side, wherein:

the high routing density patch comprises a denser trace line density than the SRS;

the semiconductor die is electrically coupled to the SRS with a first conductive pillar having a first height and with a first solder distinct from and vertically shorter than the first conductive pillar; and the semiconductor die is electrically coupled to the SRS with a second conductive pillar having a second height substantially equal to the first height, wherein the semiconductor die is electrically coupled to the high routing density patch through the second conductive pillar and through the SRS.

9. The electronic device of claim 8, comprising conductive interconnection structures laterally displaced from the high routing density patch, wherein the semiconductor die is electrically coupled to the conductive interconnection structures through the signal redistribution structure.

10. The electronic device of claim 9, wherein each of the conductive interconnection structures vertically spans the entire high routing density patch, and extends below a lowermost surface of the high routing density patch.

11. The electronic device of claim 10, wherein each of the conductive interconnection structures comprises a single continuous layer of metal that vertically spans the entire high routing density patch.

12. The electronic device of claim 8, wherein the high routing density patch comprises a silicon substrate.

13. The electronic device of claim 8, wherein signal redistribution structure comprises at least one dielectric layer and a plurality of conductive layers.

* * * * *